United States Patent
Kawai et al.

(10) Patent No.: US 11,804,820 B2
(45) Date of Patent: Oct. 31, 2023

(54) RESONATOR AND RESONANCE DEVICE

(71) Applicant: Murata Manufacturing Co., Ltd., Nagaokakyo (JP)

(72) Inventors: Ryota Kawai, Nagaokakyo (JP); Yoshihisa Inoue, Nagaokakyo (JP); Yoshiyuki Higuchi, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 17/945,277

(22) Filed: Sep. 15, 2022

(65) Prior Publication Data

US 2023/0015447 A1    Jan. 19, 2023

Related U.S. Application Data

(63) Continuation of application No. PCT/JP2020/042004, filed on Nov. 11, 2020.

(30) Foreign Application Priority Data

Apr. 27, 2020    (JP) ................................ 2020-078321

(51) Int. Cl.
*H03H 9/24* (2006.01)
*H03H 9/05* (2006.01)
*H03H 9/10* (2006.01)

(52) U.S. Cl.
CPC ........ *H03H 9/2489* (2013.01); *H03H 9/0595* (2013.01); *H03H 9/1057* (2013.01)

(58) Field of Classification Search
CPC .. H03H 9/2489; H03H 9/0595; H03H 9/1057; H03H 2009/02511; B81B 3/00
See application file for complete search history.

(56) References Cited

U.S. PATENT DOCUMENTS

| 2014/0368287 A1 | 12/2014 | Yamada et al. |
| 2018/0034441 A1 | 2/2018 | Hirota et al. |
| 2019/0052246 A1* | 2/2019 | Hirota ................. H03H 9/1057 |

FOREIGN PATENT DOCUMENTS

| JP | 2012151639 A | 8/2012 |
| JP | 2014165910 A | 9/2014 |
| JP | 2015002548 A | 1/2015 |
| JP | 2015002549 A | 1/2015 |
| JP | 20161494599 A | 8/2016 |
| WO | 2016175218 A1 | 11/2016 |
| WO | 2017195416 A1 | 11/2017 |

OTHER PUBLICATIONS

International Search Report in PCT/JP2020/042004, dated Dec. 22, 2020, 3 pages.

* cited by examiner

*Primary Examiner* — Jeffrey M Shin
(74) *Attorney, Agent, or Firm* — ArentFox Schiff LLP

(57) ABSTRACT

A resonator is provided that includes a vibration member including three or more vibration arms that each have a fixed end with at least two vibration arms performing out-of-plane bending at different phases. The resonator also includes a base having a front end connected to the fixed end of each of the vibration arms and a rear end opposing the front end. A frame holds the vibration member and two support arms are provided with first ends connected to the frame. The second ends of the two support arms are connected to a location in the rear end of the base.

20 Claims, 10 Drawing Sheets

RESONATOR AND RESONANCE DEVICE

CROSS REFERENCE TO RELATED APPLICATIONS

This application is a continuation of PCT Application No. PCT/JP2020/042004, filed Nov. 11, 2020, which claims priority to Japanese Patent Application No. 2020-078321, filed Apr. 27, 2020, the entire contents of each of which are hereby incorporated by reference in their entirety.

TECHNICAL FIELD

The present invention relates to a resonator and a resonance device, in which a plurality of vibration arms vibrates in an out-of-plane bending vibration mode.

BACKGROUND

Resonance devices utilizing a micro electro mechanical systems (MEMS) technology have been used as a timing device, for example. This resonance device is mounted on a printed circuit board to be incorporated in an electronic apparatus, such as a smartphone. The resonance device includes a lower substrate, an upper substrate forming a cavity between the lower substrate and the upper substrate, and a resonator disposed in the cavity between the lower substrate and the upper substrate.

For example, International Publication No. WO 2016/175218 (hereinafter "Patent Document 1") discloses a resonator including a plurality of vibration arms. In Patent Document 1, the resonator is provided with: a vibration portion including a base having a front end and a rear end opposing the front end, and a plurality of vibration arms extending in a direction apart from the front end with fixed ends thereof being connected to the front end of the base; a holding portion or frame disposed in at least part of a periphery of the vibration portion; and a holding arm disposed between the vibration portion and the holding portion with one end thereof being connected to the base and the other end thereof being connected to a region on the front end side relative to the rear end of the base in the holding portion. In the resonator of Patent Document 1, a connecting position at which the holding arm is connected to the base is set to be not greater than 60% with respect to half the length of the base length, thereby improving drive level dependency (DLD) (hereinafter referred to as "DLD").

In recent years, there has been an increasing demand for miniaturization of resonators. In a resonator whose dimensions are limited due to miniaturization, it is difficult to improve DLD only by the method of setting the connecting position of the holding arm to be not greater than a predetermined ratio with respect to the length of the base length as in Patent Document 1.

SUMMARY OF THE INVENTION

Accordingly, it is an object of the present invention to provide a resonator and a resonance device configured with improved DLD.

In an exemplary aspect, a resonator is provided that includes a vibration member including a plurality of vibration arms of three or more vibration arms each having a fixed end, among which at least two vibration arms perform out-of-plane bending at different phases, and also including a base having one end connected with the fixed end of each of the plurality of vibration arms and the other end opposing the one end; a frame that holds the vibration portion; and two support arms with first ends being connected to the frame and second ends being connected to one location at the other end of the base.

In another exemplary aspect, a resonance device is provided that includes the resonator described above.

DETAILED DESCRIPTION OF EMBODIMENTS

Hereinafter, exemplary embodiments of the present invention will be described. In the following description of the drawings, the same or similar constituent elements are denoted by the same or similar reference signs. The drawings are illustrative; the dimensions, shapes, and the like of the respective portions are schematic, and the technical scope of the present invention should not be construed as being limited to the embodiments.

Figure 1:
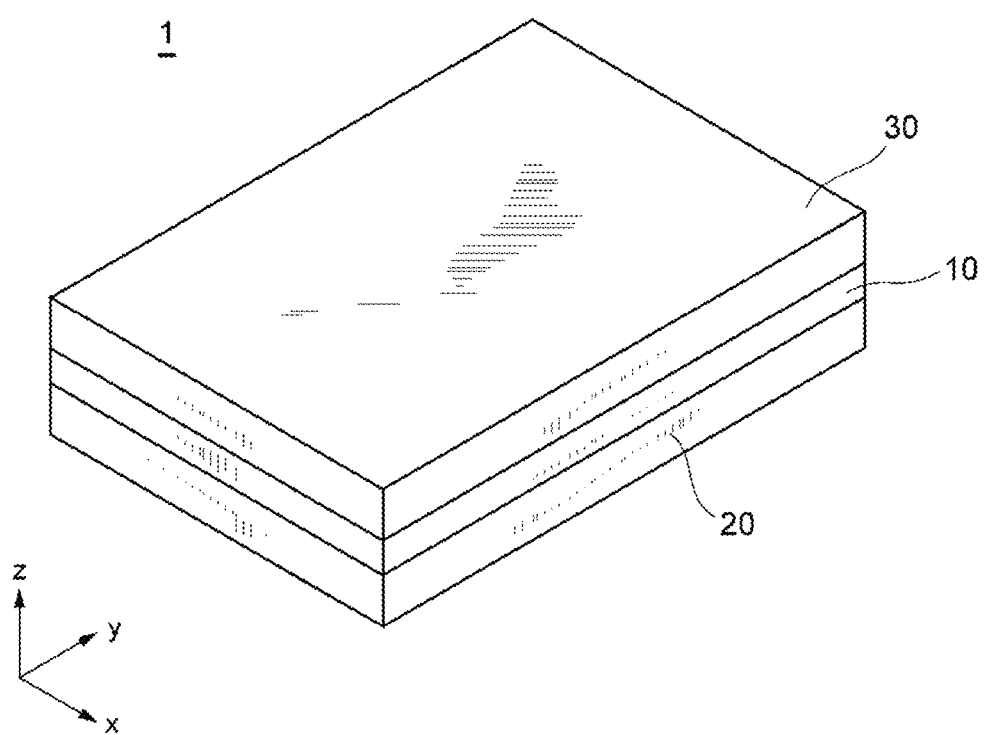
FIG. 1 is a perspective view schematically illustrating an external appearance of a resonance device according to an exemplary embodiment.
Figure 2:
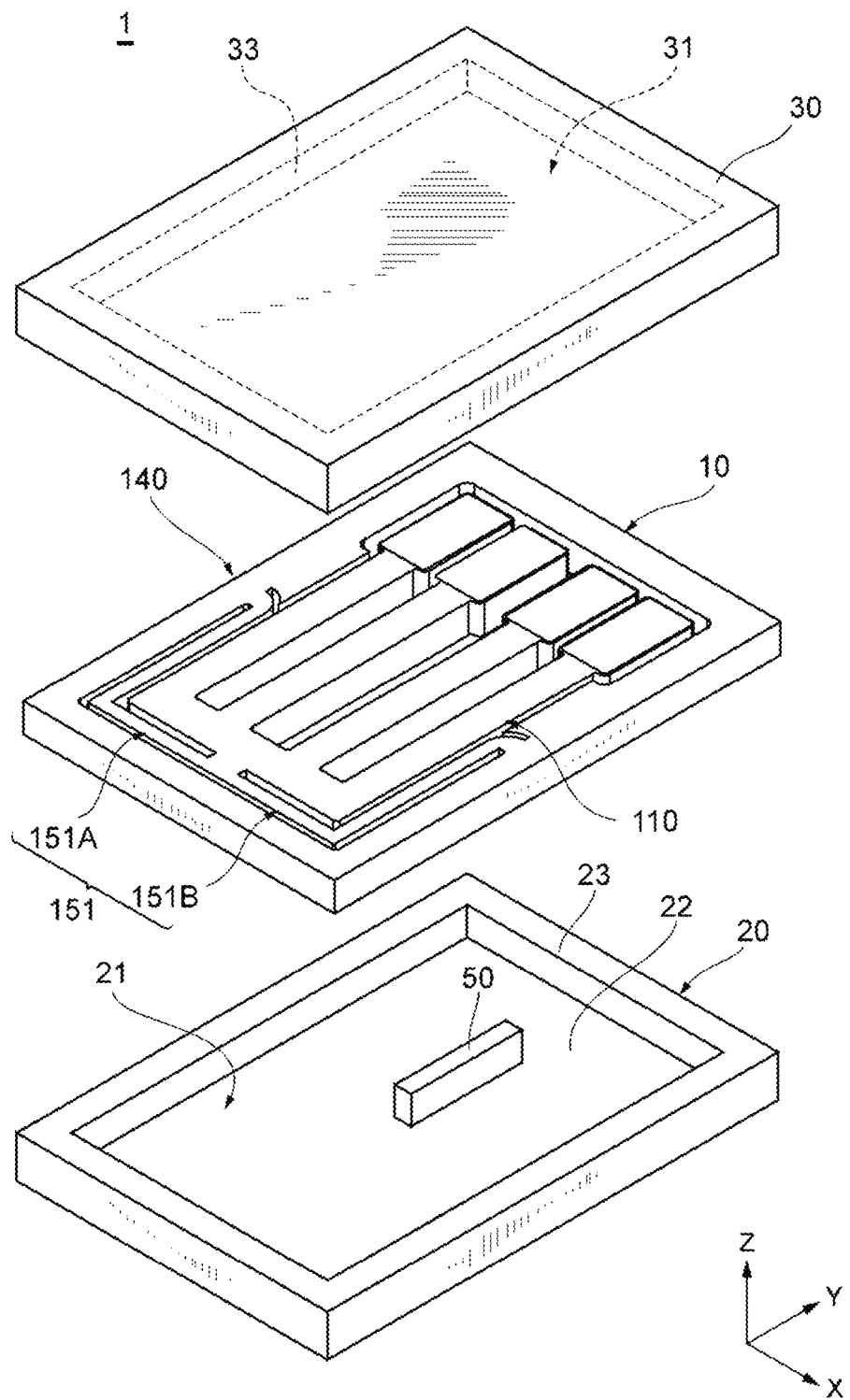
FIG. 2 is an exploded perspective view schematically illustrating a structure of the resonance device illustrated in FIG. 1.

In general, a schematic configuration of a resonance device according to an exemplary embodiment will be described with reference to FIGS. 1 and 2. FIG. 1 is a perspective view schematically illustrating an external appearance of a resonance device 1 according to the exemplary embodiment. FIG. 2 is an exploded perspective view schematically illustrating a structure of the resonance device 1 illustrated in FIG. 1.

As shown, the resonance device 1 includes a lower lid 20, a resonator 10, and an upper lid 30. That is, the resonance device 1 is formed by laminating the lower lid 20, the resonator 10, and the upper lid 30 in that order. The lower lid 20 and the upper lid 30 are disposed to face each other with the resonator 10 interposed therebetween. The lower lid 20 and the upper lid 30 correspond to an example of a "lid body" of the present disclosure.

Hereinafter, each of the configurations of the resonance device 1 will be described. In the following description, of the resonance device 1, the side on which the upper lid 30 is provided is referred to as an upper side (or a front side), and the side on which the lower lid 20 is provided is referred to as a lower side (or a rear side).

In the exemplary aspect, the resonator 10 is an MEMS vibrator manufactured using an MEMS technology. The resonator 10 is bonded to the lower lid 20 and the upper lid 30 in such a manner that the resonator 10 is sealed and a vibration space of the resonator 10 is formed. The resonator 10, the lower lid 20, and the upper lid 30 are each formed using a silicon (Si) substrate (hereinafter referred to as "Si substrate"), and the Si substrates are bonded to each other. Each of the resonator 10, the lower lid 20, and the upper lid 30 may be formed using a silicon-on-insulator (SOI) substrate in which a silicon layer and a silicon oxide film are laminated according to an exemplary aspect.

As shown in FIG. 2, the lower lid 20 includes a bottom plate 22 having a rectangular flat plate shape provided along an X-Y plane, and a side wall 23 extending from a peripheral edge portion of the bottom plate 22 in a Z-axis direction, that is, in the lamination direction of the lower lid 20 and the resonator 10. In the lower lid 20, a recess 21 defined by a front surface of the bottom plate 22 and inner surfaces of the side walls 23 is formed on a surface facing the resonator 10. The recess 21 forms at least part of the vibration space of the resonator 10. The lower lid 20 may be configured in a flat plate shape without including the recess 21. Moreover, a getter layer may be formed on a surface on the resonator 10 side of the recess 21 of the lower lid 20.

As further shown, the lower lid 20 includes a projection 50 formed on a front surface of the bottom plate 22. A detailed configuration of the projection 50 will be described later.

The upper lid 30 includes a bottom plate 32 having a rectangular flat plate shape provided along the X-Y plane, and a side wall 33 extending in the Z-axis direction from a peripheral edge portion of the bottom plate 32. In the upper lid 30, a recess 31 defined by a front surface of the bottom plate 32 and inner surfaces of the side walls 33 is formed on a surface facing the resonator 10. The recess 31 forms at least part of the vibration space, which is a space where the resonator 10 vibrates during operation. The upper lid 30 may be configured in a flat plate shape without including the recess 31. Moreover, a getter layer may be formed on a surface on the resonator 10 side of the recess 31 of the upper lid 30.

By bonding the upper lid 30, the resonator 10, and the lower lid 20, the vibration space of the resonator 10 is hermetically sealed, and a vacuum state is maintained. The vibration space may be filled with a gas such as an inert gas in an exemplary aspect.

Figure 3:
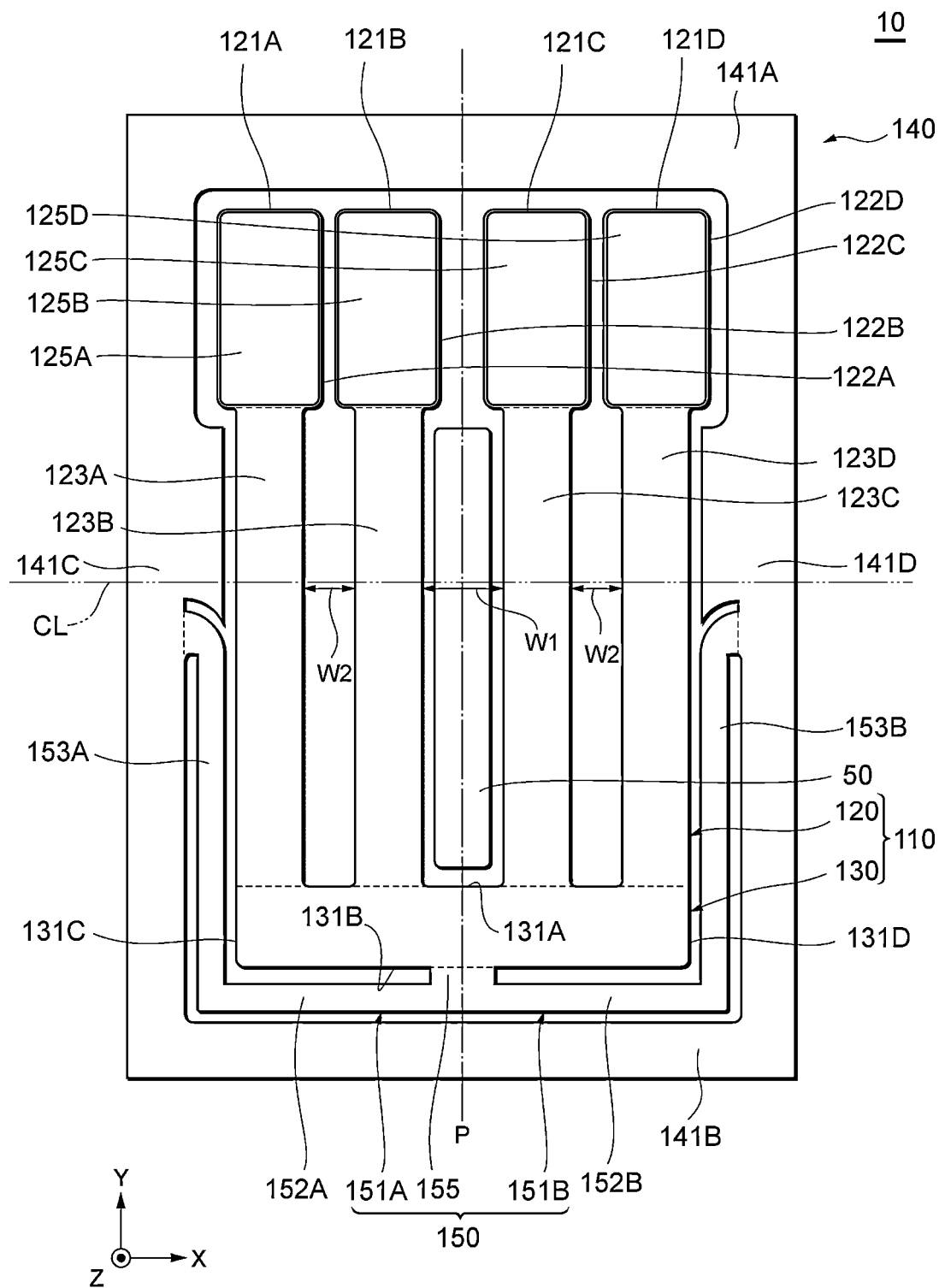
FIG. 3 is a plan view schematically illustrating a structure of a resonator illustrated in FIG. 2.

Subsequently, a schematic configuration of the resonator according to the embodiment will be described with reference to FIG. 3. FIG. 3 is a plan view schematically illustrating a structure of the resonator 10 illustrated in FIG. 2.

As illustrated in FIG. 3, the resonator 10 is an MEMS vibrator manufactured using an MEMS technology, and vibrates in an out-of-plane bending vibration mode as a main vibration (hereinafter, also referred to as a "main mode") in the X-Y plane in an orthogonal coordinate system of FIG. 3.

The resonator 10 includes a vibration portion 110 (also referred to as a "vibration member"), a holding portion 140 (also referred to as a "frame"), and a support arm portion 150.

The vibration portion 110 has a rectangular contour extending along the X-Y plane in the orthogonal coordinate system of FIG. 3. The vibration portion 110 is disposed inside the holding portion 140, and a space is formed at a predetermined interval between the vibration portion 110 and the holding portion 140. In the example of FIG. 3, the vibration portion 110 includes an excitation portion 120 that includes four vibration arms 121A to 121D (hereinafter also collectively referred to as "vibration arms 121"), and a base 130. In alternative aspects, the number of vibration arms is not limited to four, and is set to an optional number of three or more, for example. In the present embodiment, the excitation portion 120 and the base 130 are integrally formed.

The vibration arms 121A, 121B, 121C, and 121D each extend along a Y-axis direction and are provided in parallel at predetermined intervals in that order in the X-axis direction. One end of the vibration arm 121A is a fixed end connected to a front end portion 131A of the base 130 described below, and the other end of the vibration arm 121A is an open end provided apart from the front end portion 131A of the base 130. The vibration arm 121A includes a mass-adding portion 122A (e.g., a weight or weighted member) formed on the open end side and an arm portion 123A extending from the fixed end and connected to the mass-adding portion 122A. Similarly, the vibration arms 121B, 121C, and 121D respectively include mass-adding portions 122B, 122C and 122D, and arm portions 123B, 123C, and 123D. Each of the arm portions 123A to 123D is, for example, about 30 µm in width in the X-axis direction and about 400 µm in length in the Y-axis direction.

In the excitation portion 120 of the present embodiment, in the X-axis direction, two vibration arms 121A and 121D are disposed at outer side portions (e.g., "outer vibration arms"), and two vibration arms 121B and 121C are disposed at inner side portions (e.g., "inner vibration arms"). A width (hereinafter referred to as a "release width") W1 of a gap formed between the arm portions 123B and 123C of the two inner-side vibration arms 121B and 121C is set to be larger than a release width W2 between the arm portions 123A and 123B of the adjacent vibration arms 121A and 121B in the X-axis direction, and a release width W2 between the arm portions 123C and 123D of the adjacent vibration arms 121C and 121D in the X-axis direction, for example. The release width W1 is, for example, about 25 µm, and the release width W2 is, for example, about 10 µm. In this manner, by setting the release width W1 to be larger than the release widths W2, the vibration characteristics and durability of the vibration portion 110 are improved. In order to reduce the size of the resonance device 1, the release width W1 may be set to be smaller than the release width W2, or may be set to be equal to each other in alternative aspects.

Moreover, the mass-adding portions 122A to 122D include mass-adding films 125A to 125D respectively on the front surfaces thereof. Therefore, weight per unit length (hereinafter also simply referred to as "weight") of each of the mass-adding portions 122A to 122D is heavier than the weight of each of the arm portions 123A to 123D. This configuration improves the vibration characteristics while reducing the size of the vibration portion 110. The mass-adding films 125A to 125D each have not only a function of increasing the weight of the tip end portion of each of the vibration arms 121A to 121D, but also a function of serving as a so-called frequency adjustment film configured to adjust the resonant frequency of each of the vibration arms 121A to 121D by shaving part of these films.

In the present embodiment, the width of each of the mass-adding portions 122A to 122D along the X-axis direction is, for example, about 70 µm, which is larger than the width of each of the arm portions 123A to 123D along the X-axis direction. With this configuration, the weight of each of the mass-adding portions 122A to 122D may be further increased. However, it is sufficient for the weight of each of the mass-adding portions 122A to 122D to be larger than the weight of each of the arm portions 123A to 123D, and the width of each of the mass-adding portions 122A to 122D along the X-axis direction is not limited to the example of the present embodiment. The widths of the mass-adding portions 122A to 122D along the X-axis direction may be equal to or less than the widths of the arm portions 123A to 123D respectively along the X-axis direction.

In a plan view from above (hereinafter simply referred to as "in a plan view") of the resonator 10, each of the mass-adding portions 122A to 122D is formed in a substantially rectangular shape with the four corners having a rounded curved-surface shape, in other words, a so-called R shape, for example. Similarly, each of the arm portions 123A to 123D has a substantially rectangular shape in which R shapes are formed near the fixed end connected to the base 130 and near a connecting portion connected to each of the mass-adding portions 122A to 122D. It is also noted that the shape of each of the mass-adding portions 122A to 122D and the arm portions 123A to 123D is not limited to the example of the present embodiment. For example, the shape of each of the mass-adding portions 122A to 122D may take a substantially trapezoidal shape, a substantially L shape, or the like. In addition, the shape of each of the arm portions 123A to 123D may take a substantially trapezoidal shape. In each of the mass-adding portions 122A to 122D and the arm portions 123A to 123D, there may be formed a bottomed groove having an opening at either the front surface side or the rear surface side, a hole having openings at both the front surface side and the rear surface side, or the like. The groove and the hole may be separated from a side surface connecting the front surface and the rear surface, and may have the openings at the side-surface side.

The base 130 includes a front end portion 131A, a rear end portion 131B, a left end portion 131C, and a right end portion 131D in a plan view, for example to form a rectangular shape. As described above, the fixed end of each of the vibration arms 121A to 121D is connected to the front end portion 131A. As further shown, a connecting arm 155 of the support arm portion 150 described below is connected to the rear end portion 131B.

Each of the front end portion 131A, the rear end portion 131B, the left end portion 131C, and the right end portion 131D is part of an outer edge portion of the base 130. To be specific, each of the front end portion 131A and the rear end portion 131B is an end portion extending in the X-axis direction, and the front end portion 131A and the rear end portion 131B are arranged to oppose each other. Each of the left end portion 131C and the right end portion 131D is an end portion extending in the Y-axis direction, and the left end portion 131C and the right end portion 131D are arranged to oppose each other. Both ends of the left end portion 131C are connected to one end of the front end portion 131A and one end of the rear end portion 131B, respectively. Both ends of the right end portion 131D are connected to the other end of the front end portion 131A and the other end of the rear end portion 131B, respectively.

As noted above, in a plan view, the base 130 has a substantially rectangular shape in which the front end portion 131A and the rear end portion 131B are long sides and the left end portion 131C and the right end portion 131D are short sides. The base 130 is formed to be substantially plane-symmetrical with respect to a virtual plane P defined along a perpendicular bisector of both the front end portion 131A and the rear end portion 131B. It is noted that the shape of the base 130 is not limited to the rectangular shape depicted in FIG. 3, and may take another shape that is formed to be substantially plane-symmetrical with respect to the virtual plane P. For example, the shape of the base 130 may take a trapezoidal shape in which one of the front end portion 131A and the rear end portion 131B is longer than the other one. Moreover, at least one of the front end portion 131A, the rear end portion 131B, the left end portion 131C, and the right end portion 131D may be bent or curved in an alternative aspect.

As shown in FIG. 3, the virtual plane P corresponds to a plane of symmetry of the entire vibration portion 110. Accordingly, the virtual plane P is also a plane passing through the center in the X-axis direction of the vibration arms 121A to 121D, and is located between the vibration arms 121B and 121C. Specifically, the vibration arms 121A and 121B adjacent to each other are formed symmetrical with the vibration arms 121D and 121C adjacent to each other across the virtual plane P.

In the base 130, a base length which is the longest distance in the Y-axis direction between the front end portion 131A and the rear end portion 131B is, for example, about 30 µm. A base width that is the longest distance in the X-axis direction between the left end portion 131C and the right end portion 131D is, for example, about 245 µm. In the example depicted in FIG. 3, the base length corresponds to the length of the left end portion 131C or the right end portion 131D, and the base width correspond to the length of the front end portion 131A or the rear end portion 131B.

The holding portion 140 (e.g., a frame) is configured to hold the vibration portion 110. More specifically, the holding portion 140 is configured such that the vibration arms 121A to 121D can vibrate in operation. Specifically, the holding portion 140 is formed plane-symmetrical with respect to the virtual plane P. The holding portion 140 has a rectangular frame shape in a plan view, and is disposed to surround an outer side portion of the vibration portion 110 along the X-Y plane. In this manner, since the holding portion 140 has a frame shape in the plan view, the holding portion 140 can be configured to easily surround the vibration portion 110.

It is noted that the holding portion 140 is not limited to the frame shape (i.e., the complete rectangular shape), and it is sufficient for the holding portion 140 to be disposed at least in part of the periphery of the vibration portion 110. For example, it is sufficient that the holding portion 140 be disposed around the vibration portion 110 in such a manner as to hold the vibration portion 110 and to be bonded to the upper lid 30 and the lower lid 20.

In the present embodiment, the holding portion 140 includes frame bodies 141A to 141D to be integrally formed. As depicted in FIG. 3, the frame body 141A is provided with the longitudinal direction thereof parallel to the X-axis while facing the open ends of the vibration arms 121A to 121D. The frame body 141B is provided with the longitudinal direction thereof parallel to the X-axis while facing the rear end portion 131B of the base 130. The frame body 141C is provided with the longitudinal direction thereof parallel to the Y-axis while facing the left end portion 131C of the base 130 and the vibration arm 121A, and both ends thereof are respectively connected to one ends of the frame bodies 141A and 141B. The frame body 141D is provided with the longitudinal direction thereof parallel to the Y-axis while facing the right end portion 131D of the base 130 and the vibration arm 121D, and both ends thereof are respectively connected to the other ends of the frame bodies 141A and 141B. The frame body 141A and the frame body 141B face each other in the Y-axis direction across the vibration portion 110. The frame body 141C and the frame body 141D face each other in the X-axis direction across the vibration portion 110.

The support arm portion 150 is disposed inside the holding portion 140, and connects the base 130 to the holding portion 140. The support arm portion 150 is formed plane-symmetrical with respect to the virtual plane P. To be specific, the support arm portion 150 includes two support arms of a support arm 151A and a support arm 151B in a plan view. The support arm portion 150 further includes the connecting arm 155.

In particular, the support arm 151A includes a support rear arm 152A and a support side arm 153A, and the support arm 151B includes a support rear arm 152B and a support side arm 153B.

The support side arm 153A extends in parallel to the vibration arm 121A between the vibration arm 121A and the holding portion 140. The support side arm 153B extends in parallel to the vibration arm 121D between the vibration arm 121D and the holding portion 140. To be specific, the support side arm 153A extends from one end (i.e., the left end or the end on the frame body 141C side) of the support rear arm 152A toward the frame body 141A in the Y-axis direction, and bends in the X-axis direction to be connected to the frame body 141C. The support side arm 153B extends from one end (i.e., the right end or the end on the frame body 141D side) of the support rear arm 152B toward the frame body 141A in the Y-axis direction, and bends in the X-axis direction to be connected to the frame body 141D. That is, one end of each of the support arms 151A and 151B is connected to the holding portion 140.

The support rear arms 152A and 152B are coupled between the rear end portion 131B of the base 130 and the holding portion 140. To be specific, the support rear arms 152A and 152B extend along the rear end portion 131B and the frame body 141B. Then, the other end (e.g., right end) of the support rear arm 152A and the other end (e.g., left end) of the support rear arm 152B are coupled at the center in the X-axis direction of the support rear arm 152A and the support rear arm 152B.

The connecting arm 155 connects the other ends of the two coupled support arms 151A and 151B to the rear end portion 131B of the base 130. In a plan view, the connecting arm 155 is connected to the center of the rear end portion 131B of the base 130, that is, to one location of a position through which the virtual plane P passes.

In the exemplary aspect, the projection 50 projects from the recess 21 of the lower lid 20 into the vibration space. The projection 50 is disposed between the arm portion 123B of the vibration arm 121B and the arm portion 123C of the vibration arms 121C in a plan view. The projection 50 extends in the Y-axis direction in parallel with the arm portions 123B and 123C, and is formed in a prismatic shape. The length of the projection 50 in the Y-axis direction is about 240 μm, and the length thereof in the X-axis direction is about 15 μm. The number of projections 50 is not limited to one, and may be two or more in alternative aspects. As described above, since the projection 50 is disposed between the vibration arm 121B and the vibration arm 121C, and projects from the bottom plate 22 of the recess 21, the rigidity of the lower lid 20 can be increased, and both the occurrence of deflection of the resonator 10 formed on the lower lid 20 and the warpage of the lower lid 20 can be suppressed.

Figure 4:
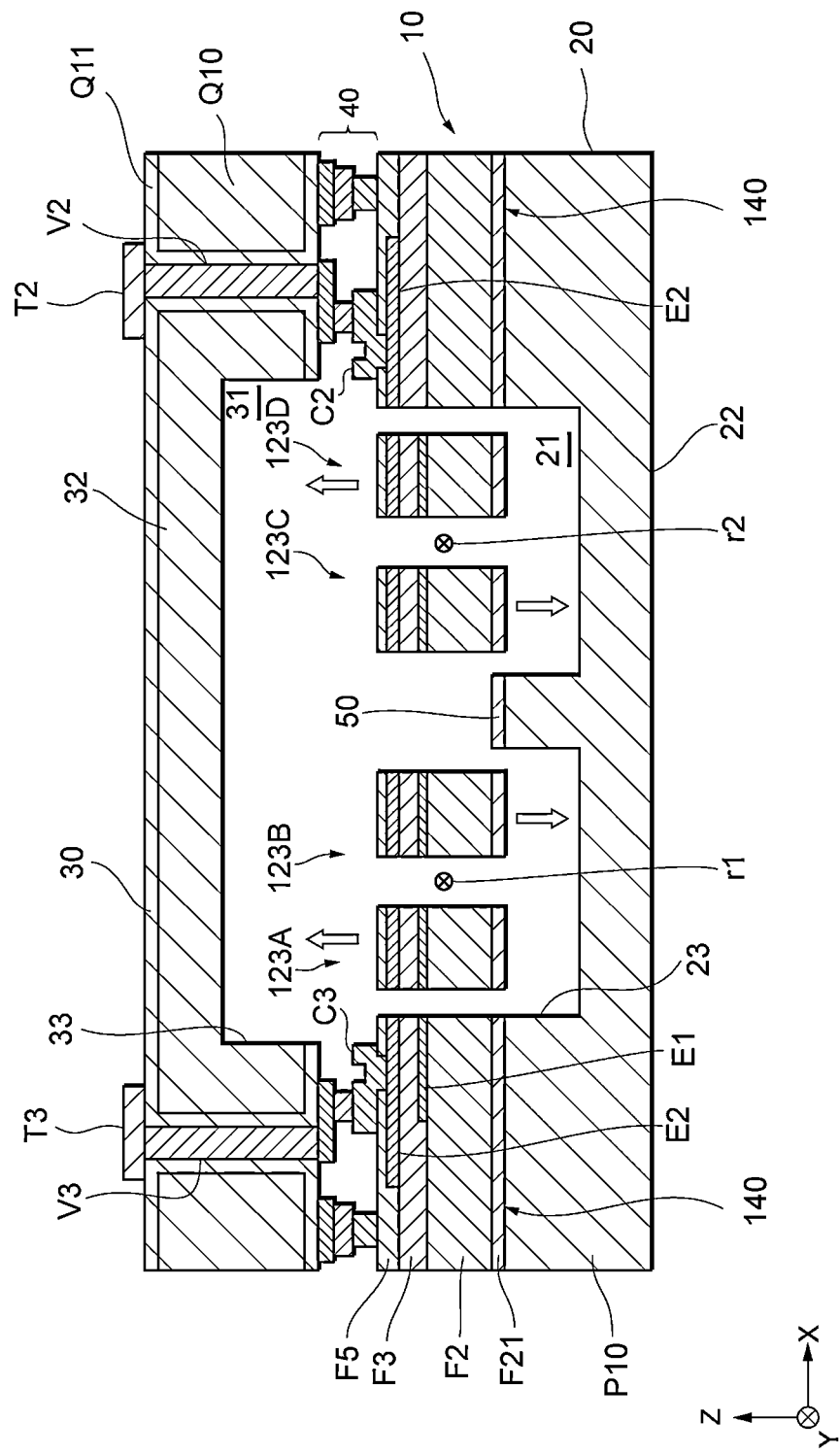
FIG. 4 is a cross-sectional view taken along an X-axis schematically illustrating a laminated structure of the resonance device illustrated in FIG. 1.
Figure 5:
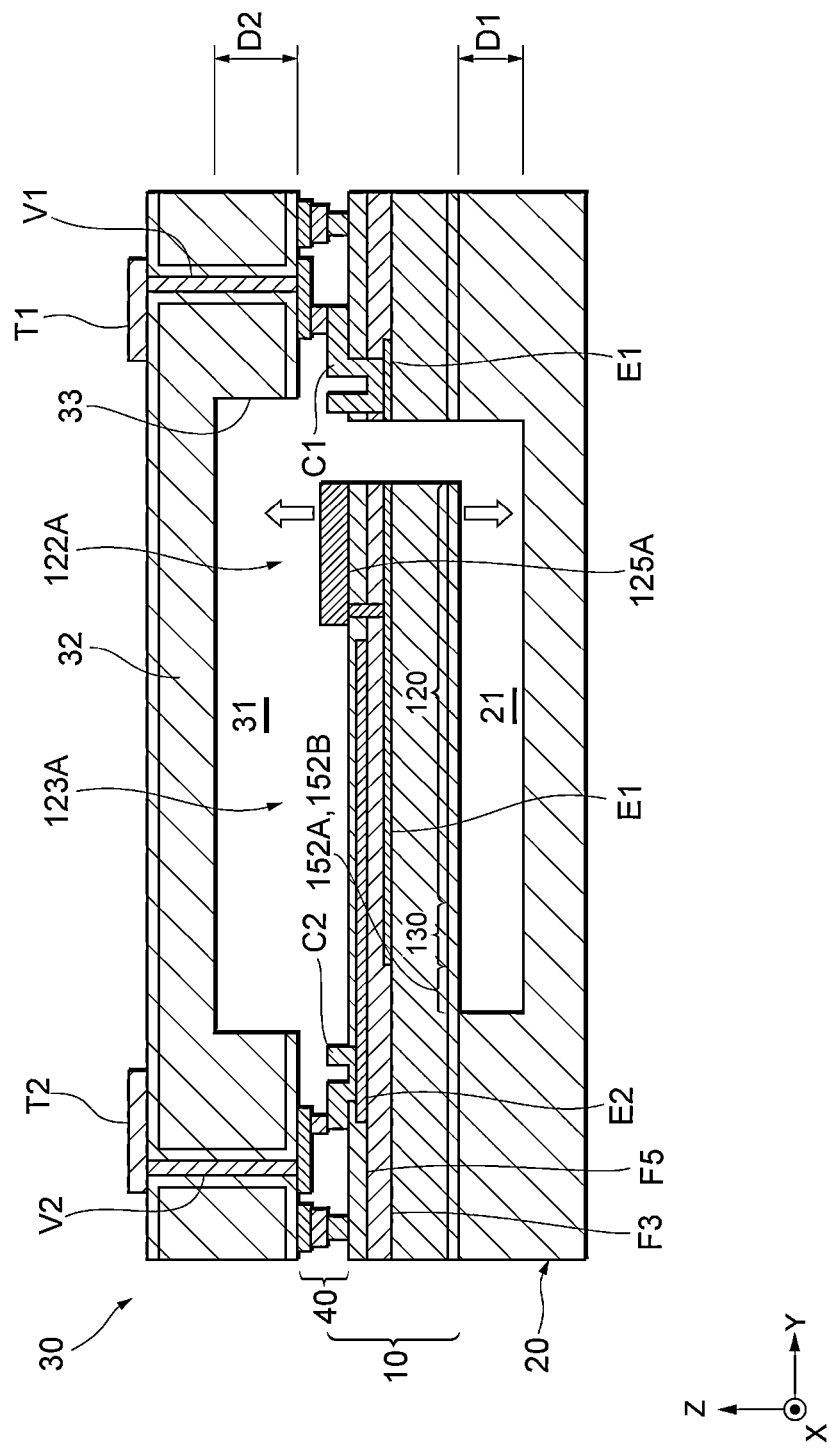
FIG. 5 is a cross-sectional view taken along a Y-axis generally illustrating the laminated structure of the resonance device illustrated in FIG. 1.

Next, with reference to FIGS. 4 and 5, a laminated structure and operation of a resonance device according to the embodiment will be described. FIG. 4 is a cross-sectional view taken along the X-axis schematically illustrating a laminated structure of the resonance device 1 illustrated in FIG. 1. FIG. 5 is a cross-sectional view taken along the Y-axis generally illustrating the laminated structure of the resonance device 1 illustrated in FIG. 1.

As illustrated in FIGS. 4 and 5, in the resonance device 1, the holding portion 140 of the resonator 10 is bonded on the side wall 23 of the lower lid 20, and the holding portion 140 of the resonator 10 and the side wall 33 of the upper lid 30 are bonded. In this manner, the resonator 10 is held between the lower lid 20 and the upper lid 30, and the vibration space in which the vibration portion 110 vibrates is formed by the lower lid 20, the upper lid 30, and the holding portion 140 of the resonator 10.

The vibration portion 110, the holding portion 140, and the support arm portion 150 of the resonator 10 are integrally formed by the same process in the exemplary aspect. In the resonator 10, a metal film E1 is laminated on a Si substrate F2, which is an example of a substrate. A piezoelectric film F3 is laminated on the metal film E1 to cover the metal film E1, and a metal film E2 is further laminated on the piezoelectric film F3. A protective film F5 is laminated on the metal film E2 to cover the metal film E2. In the mass-adding portions 122A to 122D, the above-described mass-adding films 125A to 125D are further laminated on the protective film F5, respectively. The outer shapes of the vibration portion 110, the holding portion 140, and the support arm portion 150 are each formed by patterning in which a multilayer body formed of the Si substrate F2, the metal film E1, the piezoelectric film F3, the metal film E2, the protective film F5, and the like is subjected to removal processing by dry etching that radiates an argon (Ar) ion beam, for example.

In the present embodiment, an example in which the resonator 10 includes the metal film E1 is indicated, but the embodiment is not limited thereto. For example, by the resonator 10 using a degenerate silicon substrate having low resistance as the Si substrate F2, the Si substrate F2 itself may also serve as the metal film E1, and thus the metal film E1 may be omitted.

In an exemplary aspect, the Si substrate F2 is formed of, for example, a degenerate n-type silicon (Si) semiconductor having a thickness of about 6 μm, and may contain phosphorus (P), arsenic (As), antimony (Sb), or the like as an n-type dopant. Moreover, the resistance value of the degenerate silicon (Si) used for the Si substrate F2 is, for example, less than 1.6 mΩ·cm, and more preferably not greater than 1.2 mΩ·cm. On the lower surface of the Si substrate F2, a silicon oxide layer F21 such as $SiO_2$ is formed as an example of a correction layer of temperature characteristics. This configuration improves the temperature characteristics.

In the present embodiment, the silicon oxide layer F21 is a layer configured to function to reduce a temperature coefficient of the frequency in the vibration portion 110 when the temperature correction layer is formed on the Si substrate F2, that is, a change rate per temperature at least near normal temperature, as compared with a case where the silicon oxide layer F21 is not formed on the Si substrate F2. Since the vibration portion 110 includes the silicon oxide layer F21, it is possible to reduce a temperature-dependent change of the resonant frequency of the laminated structure including the Si substrate F2, the metal films E1 and E2, the piezoelectric film F3, and the silicon oxide layer F21, for example. The silicon oxide layer may be formed on the upper surface of the Si substrate F2, or may be formed on both the upper surface and the lower surface of the Si substrate F2.

The silicon oxide layer F21 of the mass-adding portions 122A to 122D is desirably formed having a uniform thickness. For purposes of this disclosure, it is noted that uniform thickness refers to such a thickness that the variation in thickness of the silicon oxide layer F21 falls within a range of ±20% of the thickness mean value.

The metal films E1 and E2 each include an excitation electrode for exciting the vibration arms 121A to 121D, and an extended electrode for electrically connecting the excitation electrode and an external power supply. The portions of the metal films E1 and E2 configured to function as the excitation electrodes oppose each other with the piezoelectric film F3 interposed therebetween in the arm portions 123A to 123D of the vibration arms 121A to 121D. The portions of the metal films E1 and E2 configured to function as the extended electrodes are extended out of the base 130 to the holding portion 140 via the support arm portion 150, for example. The metal film E1 is electrically continued across the entire resonator 10. The metal film E2 is electrically separated at a portion formed in the vibration arms 121A and 121D, and a portion formed in the vibration arms 121B and 121C.

In the exemplary aspect, the thicknesses of the metal films E1 and E2 are each, for example, in a range from about 0.1 μm to 0.2 μm. The metal films E1 and E2, after being deposited, are patterned into the excitation electrodes, extended electrodes, and the like by removal processing such as etching. The metal films E1 and E2 are formed of, for example, a metal material whose crystal structure is a body-centered cubic structure. Specifically, the metal films E1 and E2 are formed using molybdenum (Mo), tungsten (W), or the like. As described above, since the metal films E1 and E2 mainly contain a metal whose crystal structure is a body-centered cubic structure, the metal films E1 and E2 suitable for lower and upper electrodes of the resonator 10 may be easily achieved.

The piezoelectric film F3 is a thin film formed of a kind of piezoelectric body that converts electrical energy to mechanical energy and also converts mechanical energy to electrical energy. The piezoelectric film F3 expands and contracts in the Y-axis direction among the in-plane directions of the X-Y plane in accordance with an electric field formed in the piezoelectric film F3 by the metal films E1 and E2. Due to the expansion and contraction of the piezoelectric film F3, the vibration arms 121A to 121D respectively displace the open ends thereof toward the bottom plate 22 of the lower lid 20 and toward the bottom plate 32 of the upper lid 30. Thus, according to this configuration, the resonator 10 is configured to vibrate in an out-of-plane bending vibration mode.

The thickness of the piezoelectric film F3 is, for example, about 1 μm, but may be about 0.2 μm to 2 μm. Moreover, the piezoelectric film F3 is formed of a material having a crystal structure of a wurtzite hexagonal structure, and may mainly contain, for example, nitride or oxide such as aluminum nitride (AlN), scandium aluminum nitride (ScAlN), zinc oxide (ZnO), gallium nitride (GaN), or indium nitride (InN). Scandium aluminum nitride is a compound in which part of aluminum of aluminum nitride is replaced with scandium, or part of the aluminum may be replaced with two elements such as magnesium (Mg) and niobium (Nb) or magnesium (Mg) and zirconium (Zr) instead of scandium. As described above, since the piezoelectric film F3 contains a piezoelectric body whose crystal structure takes a wurtzite hexagonal structure as a main component, the piezoelectric film F3 suitable for the resonators 10 may be easily achieved.

The protective film F5 protects the metal film E2 from oxidation. It is noted that the protective film F5 does not have to be exposed with respect to the bottom plate 32 of the upper lid 30 as long as the protective film F5 is provided on the upper lid 30 side. For example, a parasitic capacitance reduction film or the like for reducing the capacitance of wiring lines formed in the resonator 10 may be formed in such a manner as to cover the protective film F5. The protective film F5 is formed of, for example, an insulating film such as silicon nitride (SiN), silicon oxide ($SiO_2$), alumina oxide ($Al_2O_3$), or tantalum pentoxide ($Ta_2O_5$) in addition to a piezoelectric film such as aluminum nitride (AlN), scandium aluminum nitride (ScAlN), zinc oxide (ZnO), gallium nitride (GaN), or indium nitride (InN). The protective film F5 is formed to have a thickness not greater than half the thickness of the piezoelectric film F3, and the thickness of the protective film F5 is, for example, about 0.2 μm in the present embodiment. A more preferable thickness of the protective film F5 is approximately one fourth the thickness of the piezoelectric film F3. When the protective film F5 is formed of a piezoelectric body such as aluminum nitride (AlN), it is preferable to use a piezoelectric body having the same orientation as the piezoelectric film F3.

Moreover, it is desirable that the protective film F5 of the mass-adding portions 122A to 122D be formed having a uniform thickness. As noted above, for purposes of this disclosure, uniform thickness refers to such a thickness that the variation in thickness of the protective film F5 falls within a range of ±20% of the thickness mean value.

The mass-adding films 125A to 125D form the front surfaces on the upper lid 30 side of the mass-adding portions 122A to 122D respectively, and correspond to the frequency adjustment films of the vibration arms 121A to 121D respectively. The frequency of the resonator 10 is adjusted by a trimming process of removing part of each of the mass-adding films 125A to 125D. The mass-adding films 125A to 125D are preferably formed of a material having a faster mass reduction rate by etching than the protective film F5 from the perspective of frequency adjustment efficiency. The mass reduction rate is represented by the product of the etching rate and the density. The etching rate refers to the thickness removed per unit time. In the case where the relationship of the mass reduction rates between the protective film F5 and the mass-adding films 125A to 125D is as described above, the magnitude correlation of the etching rate is optional. From the perspective of efficiently increasing the weight of the mass-adding portions 122A to 122D, the mass-adding films 125A to 125D are preferably formed of a material with a large specific gravity. For these reasons, the mass-adding films 125A to 125D are formed of a metal material such as molybdenum (Mo), tungsten (W), gold (Au), platinum (Pt), nickel (Ni), aluminum (Al), or titanium (Ti).

In addition, part of the upper surface of each of the mass-adding films 125A to 125D is removed by the trimming process in the frequency adjustment step. The trimming process of the mass-adding films 125A to 125D may be performed by, for example, dry etching in which an argon (Ar) ion beam is radiated. The ion beam is excellent in process efficiency because a wide area can be irradiated with the ion beam, but there is a risk that the mass-adding films 125A and 125D are charged because the ion beam has electric charge. The mass-adding films 125A to 125D are preferably grounded in order to prevent the vibration characteristics of the resonator 10 from being degraded due to changes in vibration paths of the vibration arms 121A to 121D caused by the Coulomb interaction due to charging of the mass-adding films 125A to 125D.

As further shown in FIGS. 4 and 5, for example, extended lines C1, C2, and C3 are formed on the protective film F5 of the holding portion 140. The extended line C1 is electrically connected to the metal film E1 through a through-hole formed in the piezoelectric film F3 and the protective film F5. The extended line C2 is electrically connected to a portion of the metal film E2 formed in the vibration arms 121A and 121D through a through-hole formed in the protective film F5. The extended line C3 is electrically connected to a portion of the metal film E2 formed in the vibration arms 121B and 121C through a through-hole formed in the protective film F5. In an exemplary aspect, the extended lines C1 to C3 are formed of a metal material such as aluminum (Al), germanium (Ge), gold (Au), or tin (Sn), for example.

In the present embodiment, FIG. 4 illustrates an example in which the arm portions 123A to 123D, the extended lines C2 and C3, through electrodes V2 and V3, and the like are located on a cross section of the same plane, but these elements are not necessarily located on the cross section of the same plane. For example, the through electrodes V2 and V3 may be formed at positions separated in the Y-axis direction from a cross section parallel to a Z-X plane defined by the Z-axis and the X-axis and cutting the arm portions 123A to 123D.

Likewise, in the present embodiment, FIG. 5 illustrates an example in which the mass-adding portion 122A, the arm portion 123A, the extended lines C1 and C2, a through electrode V1 and the through electrode V2, and the like are located on a cross section of the same plane, but these elements are not necessarily located on the cross section of the same plane.

The bottom plate 22 and the side walls 23 of the lower lid 20 are integrally formed by a silicon (Si) substrate P10. Moreover, the Si substrate P10 is made of non-degenerate silicon and has a resistivity of, for example, 10 Ω·cm or more. Inside the recess 21 of the lower lid 20, the Si substrate P10 is exposed. The silicon oxide layer F21 is formed on the upper surface of the projection 50. However, from the perspective of suppressing the charging of the projection 50, on the upper surface of the projection 50, the Si substrate P10 having electric resistivity lower than that of the silicon oxide layer F21 may be exposed, or a conductive layer may be formed.

The thickness of the lower lid 20 defined in the Z-axis direction is about 150 µm, and the depth of the recess 21 defined in the same manner is about 50 µm.

The bottom plate 32 and the side walls 33 of the upper lid 30 are integrally formed by a silicon (Si) substrate Q10. Preferably, the front and rear surfaces of the upper lid 30 and inner side surfaces of the through-holes are covered with a silicon oxide film Q11. The silicon oxide film Q11 is formed on the front surface of the Si substrate Q10 by, for example, oxidation of the Si substrate Q10 or chemical vapor deposition (CVD). The Si substrate Q10 is exposed inside the recess 31 of the upper lid 30. A getter layer may be formed on a surface of the recess 31 of the upper lid 30 on the side facing the resonator 10. The getter layer is formed of, for example, titanium (Ti), and suctions outgas released from a bonding portion 40 or the like described below, and suppresses a reduction in the degree of vacuum of the vibration space. The getter layer may be formed on a surface of the recess 21 of the lower lid 20 on the side facing the resonator 10, or may be formed on the surface of each of the recess 21 of the lower lid 20 and the recess 31 of the upper lid 30 on the side facing the resonator 10.

The thickness of the upper lid 30 defined in the Z-axis direction is about 150 µm, and the depth of the recess 31 defined in the same manner is about 50 µm.

According to the exemplary embodiment, terminals T1, T2, and T3 are provided on an upper surface of the upper lid 30 (e.g., a surface on the opposite side to the surface facing the resonator 10). The terminal T1 is a mounting terminal for grounding the metal film E1. The terminal T2 is a mounting terminal for electrically connecting the metal film E2 of the vibration arms 121A and 121D to the external power supply. The terminal T3 is a mounting terminal for electrically connecting the metal film E2 of the vibration arms 121B and 121C to the external power supply. The terminals T1 to T3 are each formed by plating a metallized layer (base layer) of chromium (Cr), tungsten (W), nickel (Ni), or the like with nickel (Ni), gold (Au), silver (Ag), or copper (Cu), for example. A dummy terminal electrically insulated from the resonator 10 may be formed on the upper surface of the upper lid 30 for the purpose of adjusting the parasitic capacitance, the mechanical strength balance, and the like.

Moreover, the through electrodes V1, V2, and V3 are each formed in the interior of the side wall 33 of the upper lid 30. The through electrode V1 electrically connects the terminal T1 and the extended line C1, the through electrode V2 electrically connects the terminal T2 and the extended line C2, and the through electrode V3 electrically connects the terminal T3 and the extended line C3. The through electrodes V1 to V3 are each formed by filling, with a conductive material, a through-hole passing through the side wall 33 of the upper lid 30 in the Z-axis direction. The conductive material used to fill the through-hole is, for example, polycrystalline silicon (Poly-Si), copper (Cu), or gold (Au).

The bonding portion 40 is formed between the side wall 33 of the upper lid 30 and the holding portion 140, and the upper lid 30 is bonded to the resonator 10 by the bonding portion 40. Moreover, the bonding portion 40 is formed in a closed ring shape surrounding the vibration portion 110 in the X-Y plane so as to hermetically seal the vibration space of the resonator 10 in a vacuum state. The bonding portion 40 is formed of a metal film in which, for example, an aluminum (Al) film, a germanium (Ge) film, and an aluminum (Al) film are laminated in that order to achieve eutectic bonding. The bonding portion 40 may be formed of a combination of films appropriately selected from gold (Au), tin (Sn), copper (Cu), titanium (Ti), silicon (Si), and the like. In order to improve close contact properties, the bonding portion 40 may include a metal compound such as titanium nitride (TiN) or tantalum nitride (TaN) between films.

In the present embodiment, the terminal T1 is grounded, and alternating voltages having phases opposite to each other are applied to the terminals T2 and T3 in operation. Accordingly, the phase of an electric field formed in the piezoelectric film F3 of the vibration arms 121A and 121D is opposite to the phase of an electric field formed in the piezoelectric film F3 of the vibration arms 121B and 121C. This causes the displacement of the vibration arms 121A and 121D at the outer side portions to be opposite in direction to the displacement of the vibration arms 121B and 121C at the inner side portions.

For example, as illustrated in FIG. 4, when the mass-adding portions 122A and 122D and the arm portions 123A and 123D of the respective vibration arms 121A and 121D are displaced toward the inner surface of the upper lid 30, the mass-adding portions 122B and 122C and the arm portions 123B and 123C of the respective vibration arms 121B and 121C are displaced toward the inner surface of the lower lid 20. Although not illustrated, when the mass-adding portions 122A and 122D and the arm portions 123A and 123D of the respective vibration arms 121A and 121D are displaced conversely toward the inner surface of the lower lid 20, the mass-adding portions 122B and 122C and the arm portions 123B and 123C of the respective vibration arms 121B and 121C are displaced toward the inner surface of the upper lid 30. Thus, at least two of the four vibration arms 121A to 121D perform out-of-plane bending at different phases.

In this way, the vibration arms 121A and 121B vibrate in mutually different up-down directions, when the voltage is applied to the terminals as discussed above, about a center axis r1 extending in the Y-axis direction between the adjacent vibration arms 121A and 121B. Further, the vibration arms 121C and 121D vibrate in the mutually different up-down directions about a center axis r2 extending in the Y-axis direction between the adjacent vibration arms 121C and 121D. Thus, torsional moments in mutually opposite directions are generated at the center axes r1 and r2, and bending vibrations are generated in the vibration portion 110. The maximum amplitude of the vibration arms 121A to 121D is about 50 μm, and the amplitude thereof during normal driving is about 10 μm.

Figure 6:
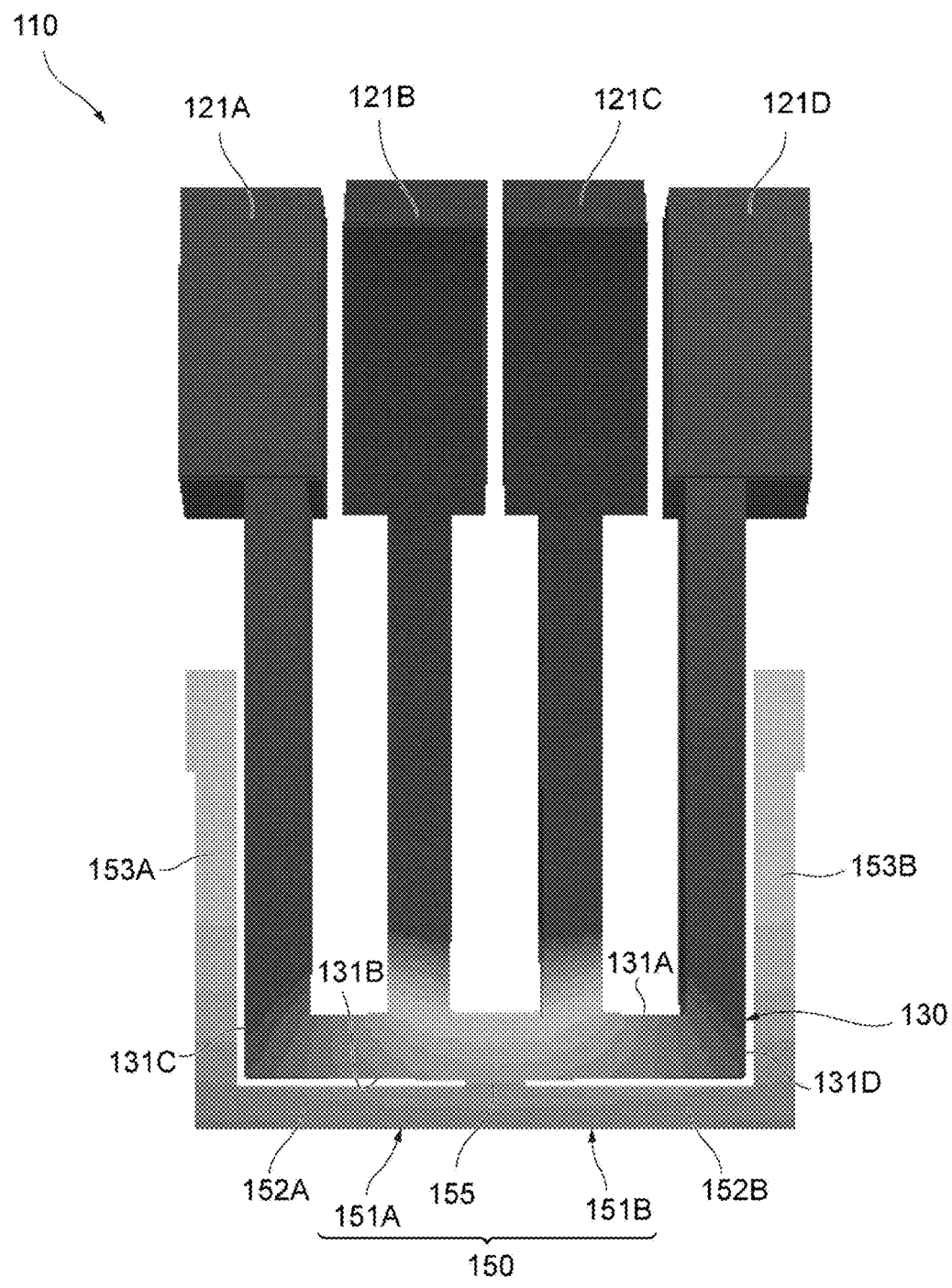
FIG. 6 is a plan view schematically depicting a displacement distribution brought about by vibrations of a vibration portion illustrated in FIG. 3.
Figure 7:
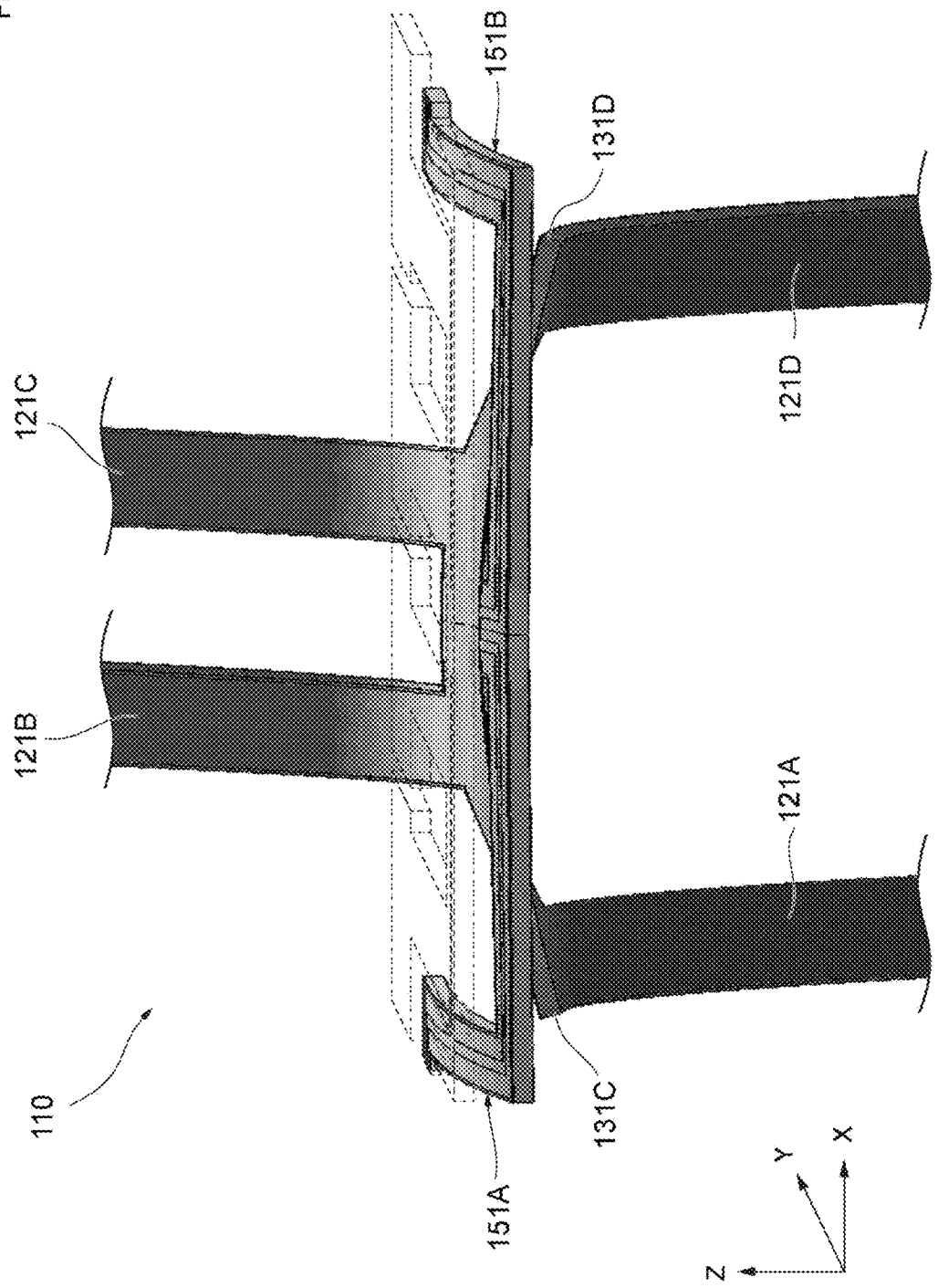
FIG. 7 is a perspective view schematically depicting a displacement distribution brought about by vibrations of the vibration portion illustrated in FIG. 3.

Next, with reference to FIGS. 6 and 7, displacement brought about by vibrations of the vibration portion will be described. FIG. 6 is a plan view schematically depicting a displacement distribution brought about by vibrations of the vibration portion 110 illustrated in FIG. 3. FIG. 7 is a perspective view schematically depicting a displacement distribution brought about by vibrations of the vibration portion 110 illustrated in FIG. 3. In the vibration portion 110 illustrated in FIGS. 6 and 7, a dark region indicates large displacement, and a light region indicates small displacement.

As illustrated in FIGS. 6 and 7, since the vibration portion 110 vibrates in the out-of-plane bending vibration mode, the displacement of the vibration arms 121A to 121D increases. Along with the displacement of the vibration arms 121A to 121D, the base 130 held by the holding portion 140 through the support arm portion 150 is also deflected and displaced. In the present embodiment, since the respective other ends of the two support arms 151A and 151B are connected to one location in the rear end portion 131B of the base 130, the deflection of the base 130 is large, and the displacement thereof, more specifically, the displacement of the left end portion 131C and the right end portion 131D of the base 130 is increased, as compared to the related art.

Figure 8:
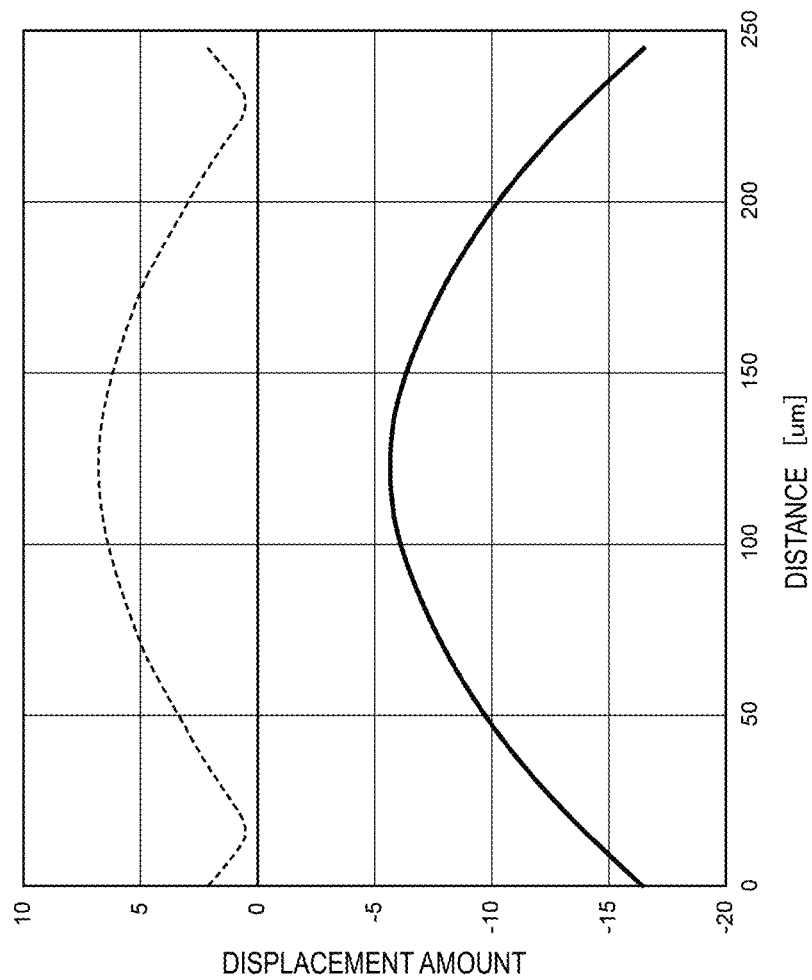
FIG. 8 is a graph depicting a displacement amount of a base brought about by vibrations of the vibration portion illustrated in FIG. 3.

The displacement amount of the base brought about by vibrations of the vibration portion will be described below with reference to FIG. 8. FIG. 8 is a graph depicting a displacement amount of the base 130 brought about by the vibrations of the vibration portion 110 illustrated in FIG. 3. In FIG. 8, the horizontal axis represents a distance when the left end portion 131C of the base 130 is set as a reference, that is, set to be 0, and the vertical axis represents a relative value of the displacement amount. In FIG. 8, the displacement amount of the resonator 10 of the present embodiment is indicated by a solid line, while the displacement amount of a resonator of the related art is indicated by a dotted line for comparison. The resonator of the related art has the same structure as that of the resonator 10 except that the two support arms are separately connected to the rear end portion of the base, that is, connected at two locations.

As indicated by the dotted line in FIG. 8, in the resonator of the related art, the displacement amount of the base is smallest near the connecting location with each of the support arms, and is largest near the center portion of the base.

On the other hand, in the resonator 10 of the present embodiment, as indicated by the solid line in FIG. 8, the displacement amount of the base 130 is smallest near the center portion of the base 130, and is largest at both end portions of the base 130, that is, at the left end portion 131C and the right end portion 131D. The displacement amount at the left end portion 131C and the right end portion 131D has such a value that the absolute value thereof is larger than the absolute value of the displacement amount near the center portion of the base of the resonator of the related art. With this, it is understood that the displacement amount of the base 130 of the resonator 10 of the present embodiment is large compared to the resonator of the related art.

As discussed above, since the respective other ends of the two support arms 151A and 151B are connected to one location in the rear end portion 131B of the base 130, the deflection of the base 130 is significantly larger compared to the resonator of the related art. As a result, a frequency change rate per unit power of the resonant frequency can be changed as described below, which serves as an indicator of DLD, to the negative direction. Thus, the frequency change rate per unit power of the resonant frequency can be reduced, and the DLD can be further improved.

Further, the other ends of the two support arms 151A and 151B are coupled to each other, and the connecting arm 155 connects the other ends of the coupled two support arms 151A and 151B to the rear end portion 131B of the base 130, so that the other ends of the two support arms 151A and 151B are easily connected to one location in the rear end portion 131B of the base 130 via the connecting arm 155.

Since the other end of each of the two support arms 151A and 151B is connected to one location at the center of the rear end portion 131B of the base 130 in a plan view, the deflection of the base 130 is likely to be large.

Figure 9:
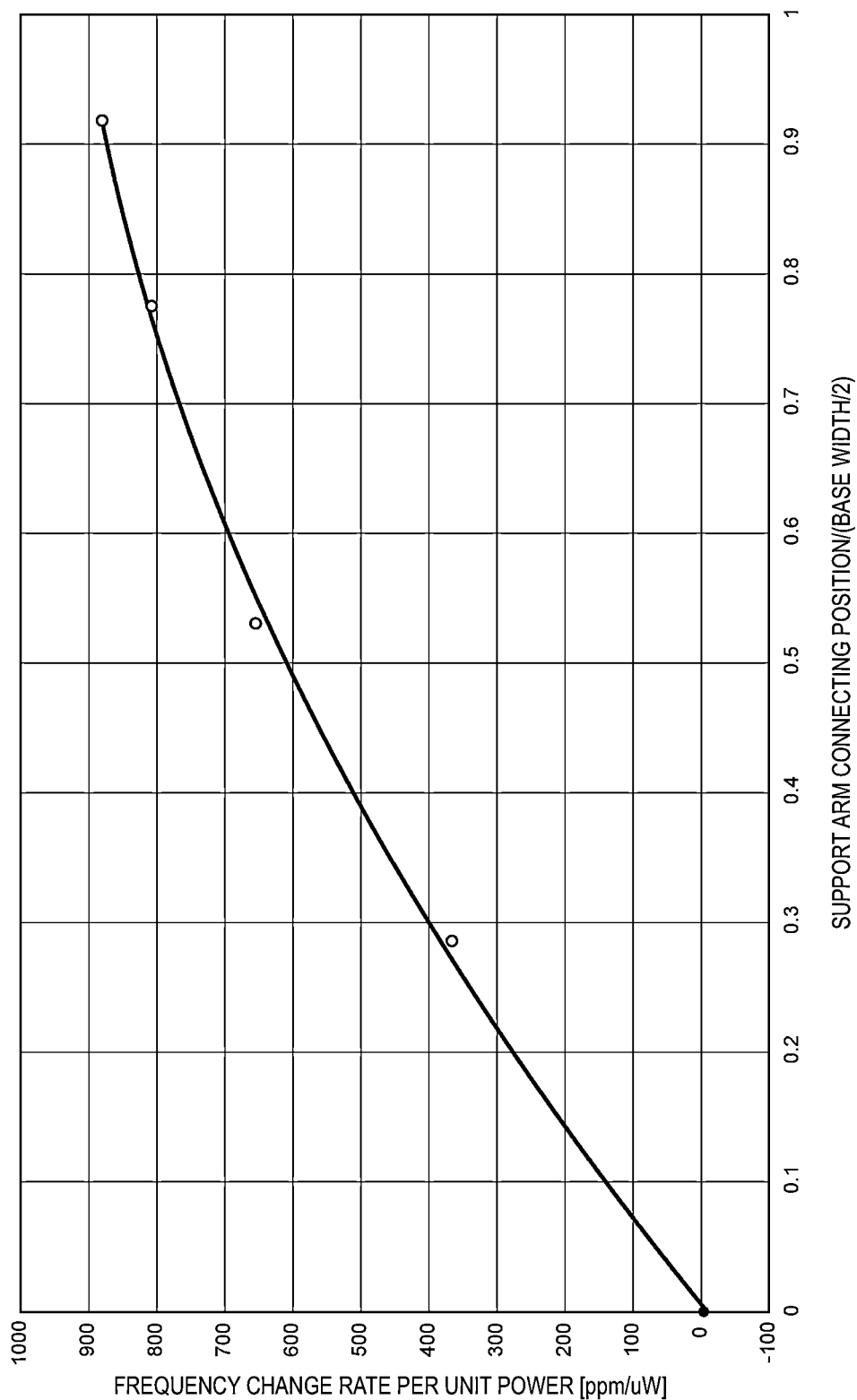
FIG. 9 is a graph depicting a relationship between DLD and a connecting location of a support arm portion in the base illustrated in FIG. 3.

Next, with reference to FIG. 9, a relationship between DLD and a connecting position of the support arm portion in the base will be described. FIG. 9 is a graph illustrating a relationship between DLD and the connecting location of the support arm portion 150 in the base 130 illustrated in FIG. 3. In FIG. 9, the horizontal axis represents a value obtained by dividing a distance to the connecting position of the two support arms 151A and 151B when the center of the rear end portion 131B of the base 130 in a plan view is set as a reference, that is, set to 0 by half the base width. The vertical axis represents a frequency change rate (df/f) per unit power (1 μW) of the resonant frequency (f), which is an indicator of DLD. In FIG. 9, the frequency change rate per unit power in the resonator 10 of the present embodiment is plotted with a black circle, while the frequency change rate per unit power in the resonator of the related art is plotted with a white circle for comparison.

As shown with white circles in FIG. 9, in the case of the resonator of the related art in which the two support arms are connected to the rear end portion of the base at two locations, the frequency change rate per unit power obtained as the most favorable precision was only about 380 [ppm/μm].

On the other hand, in the resonator 10 of the present embodiment, as depicted with the black circle in FIG. 9, the other ends of the two support arms 151A and 151B are connected to one location in the rear end portion 131B of the base 130, and thus the frequency change rate per unit power changes to the negative direction. In the present embodiment, the other ends of the two support arms 151A and 151B are connected to one location at the center in the rear end portion 131B of the base 130 in a plan view, which makes it possible to achieve substantially 0 [ppm/μm] as the frequency change rate per unit power.

Figure 10:
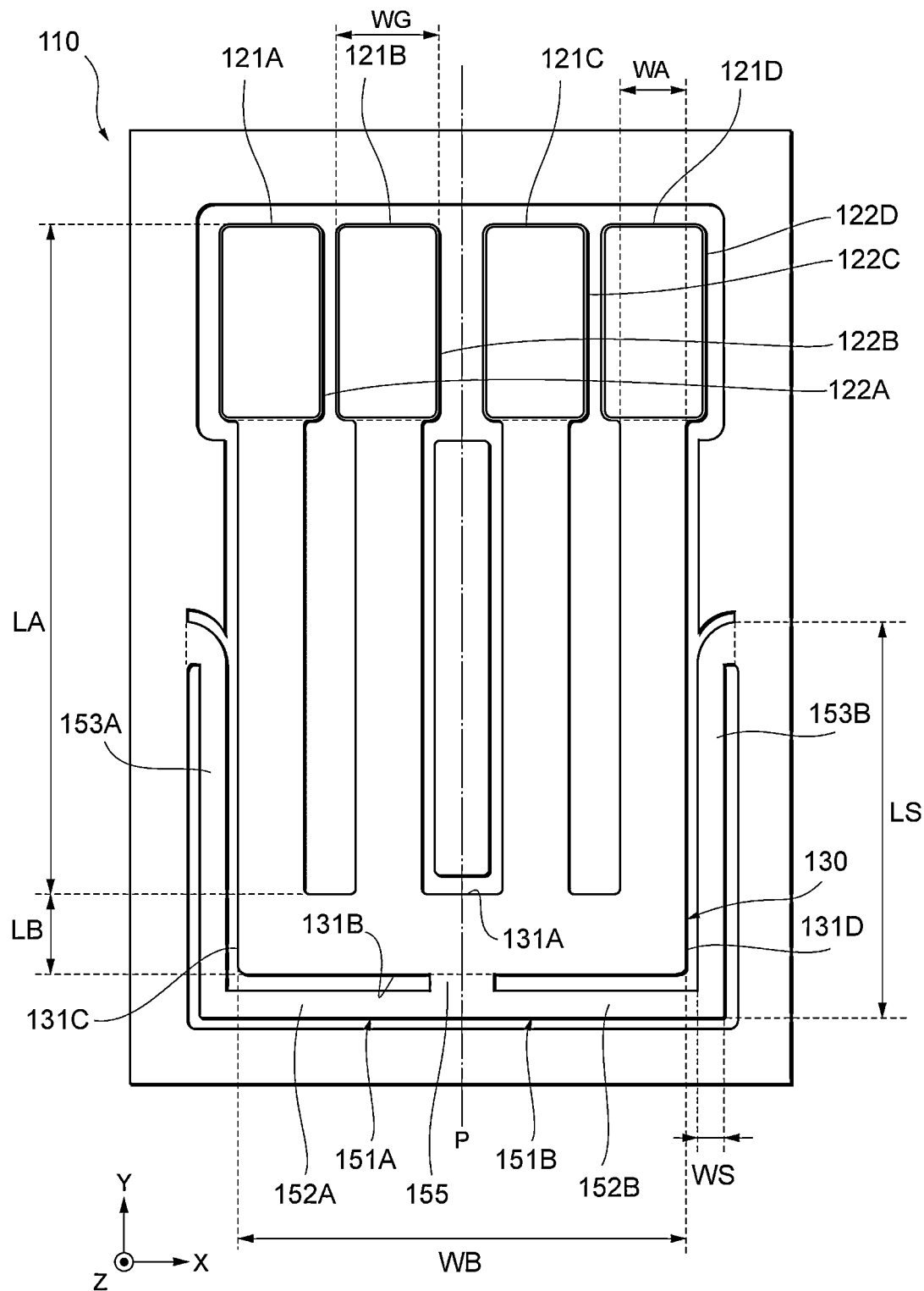
FIG. 10 is a plan view for describing dimensions of the vibration portion illustrated in FIG. 3.

Next, dimensions of the vibration portion in a plan view will be described with reference to FIG. 10. FIG. 10 is a plan view for illustrating the dimensions of the vibration portion 110 illustrated in FIG. 3.

As illustrated in FIG. 10, in the vibration portion 110 of the resonator 10 of the present embodiment, a width WG along the X-axis direction of each of the mass-adding portions 122A to 122D is, for example, 70 μm. A vibration arm width WA along the X-axis direction of each of the vibration arms 121A to 121D is, for example, 30 μm, and a vibration arm length LA along the Y-axis direction of each of the vibration arms 121A to 121D is, for example, 400 μm.

In the base 130, a distance in a length direction of a direction from the front end portion 131A toward the rear end portion 131B, that is, a base width WB is, for example, 245 μm. On the other hand, a distance in a width direction of a direction from the left end portion 131C toward the right end portion 131D, that is, a base length LB is, for example, 30 μm.

The inventors of the present invention have found that when the length ratio of the base length LB to the base width WB is equal to or less than a predetermined multiple, the frequency change rate per unit power of the resonant frequency is reduced. More specifically, it has been found that the length of the base length LB is preferably 0.3 times or less the length of the base width WB. This configuration effectively reduces the frequency change rate per unit power of the resonant frequency.

Specifically, in the miniaturized resonator 10, the length of the base length LB is 90 μm or less, and the length of the base width WB is 300 μm or less. This configuration effectively reduces the frequency change rate per unit power of the resonant frequency even in the resonator 10 with the limited dimensions due to miniaturization.

In the support arm portion 150, the length of a support arm width WS along the X-axis direction of each of the support arms 151A and 151B is, for example 25 μm, and the length of a support arm length LS along the Y-axis direction of each of the support arms 151A and 151B is, for example, 225 μm.

The inventors of the present invention have also found that when the length ratio of the support arm length LS to the support arm width WS is equal to or more than a predetermined multiple, the frequency change rate per unit power of the resonant frequency is reduced. More specifically, it has been found that the length of the support arm length LS is preferably four times or more the length of the support arm width WS. This configuration effectively reduces the frequency change rate per unit power of the resonant frequency.

Specifically, in the miniaturized resonator 10, the length of the support arm length LS is 300 μm or less, and the length of the support arm width WS is 60 μm or less. This configuration effectively reduces the frequency change rate per unit power of the resonant frequency even in the resonator 10 with the limited dimensions due to miniaturization.

In the present embodiment, an example in which the vibration portion 110 of the resonator 10 includes the four vibration arms 121A to 121D is used, but the embodiment is not limited thereto as discussed above. The vibration portion 110 may include, for example, three or more than four vibration arms in alternative embodiments. In this case, at least two vibration arms perform out-of-plane bending at different phases.

Thus far, an exemplary embodiment of the present invention has been described. In the resonator according to the embodiment, the respective other ends of the two support arms are connected to one location in the rear end portion of the base. With this, the deflection of the base becomes large compared to the resonator of the related art, and consequently the frequency change rate per unit power of the resonant frequency can be changed, which serves as an indicator of DLD, to the negative direction. Thus, the frequency change rate per unit power of the resonant frequency can be reduced, and the DLD can be further improved.

In the resonator described above, the other ends of the two support arms are coupled to each other, and the connecting arm connects the other ends of the coupled two support arms to the rear end portion of the base. With this configuration, the other ends of the two support arms may be easily connected to one location in the rear end portion of the base via the connecting arm.

In the resonator described above, the other ends of the two support arms are connected to one location at the center of the rear end portion of the base in a plan view. This configuration makes the deflection of the base likely to increase.

In the above-described resonator, the length of the base length is 0.3 times or less the length of the base width. The inventors of the present invention have found that when the length ratio of the base length to the base width is equal to or less than a predetermined multiple, more specifically equal to or less than 0.3 times, the frequency change rate per unit power of the resonant frequency may be reduced. This configuration effectively reduces the frequency change rate per unit power of the resonant frequency.

In the resonator described above, the length of the base length is 90 μm or less, and the length of the base width is 300 μm or less. This configuration effectively reduces the frequency change rate per unit power of the resonant frequency even in a resonator with the limited dimensions due to miniaturization.

In the above-described resonator, the length of the support arm length is four times or more the length of the support arm width. The inventors of the present invention have found that when the length ratio of the support arm length to the support arm width is equal to or more than a predetermined multiple, more specifically equal to or more than four times, the frequency change rate per unit power of the resonant frequency may be reduced. This configuration effectively reduces the frequency change rate per unit power of the resonant frequency.

In the above-described resonator, the length of the support arm length is 300 μm or less, and the length of the support arm width is 60 μm or less. This configuration effectively reduces the frequency change rate per unit power of the resonant frequency even in a resonator with the limited dimensions due to miniaturization.

The resonance device according to the embodiment includes the resonator described above. As a result, resonance device is provided with further improved DLD.

The above-described resonance device further includes the lower lid and the upper lid. With this configuration, the vibration space of the vibration portion that performs out-of-plane bending can be easily formed.

In general, it is noted that the above-described embodiments are intended to facilitate understanding of the present invention, and are not intended to limit interpretation of the present invention. The present invention may be changed/improved without departing from the gist thereof, and the present invention includes equivalents thereof. That is, the products obtained by appropriately carrying out design change by those skilled in the art on the embodiments and/or the modified examples are also included in the scope of the present invention as long as the features of the present invention are included. For example, the constituent elements included in the embodiments and/or the modified examples, and the arrangement, materials, conditions, shapes, sizes and the like thereof are not limited to those that are exemplified, and may be appropriately changed. The embodiments and the modified examples are merely examples, and it is needless to say that partial replacement or combination of the configurations described in the different embodiments and/or modified examples is possible, and these resultants are also included in the scope of the present invention as long as the features of the present invention are included.

REFERENCE SIGNS LIST

1 RESONANCE DEVICE
10 RESONATOR
20 LOWER LID
21 RECESS
22 BOTTOM PLATE
23 SIDE WALL
30 UPPER LID
31 RECESS
32 BOTTOM PLATE
33 SIDE WALL
40 BONDING PORTION
50 PROJECTION
110 VIBRATION PORTION
120 EXCITATION PORTION
121 VIBRATION ARM
121A, 121B, 121C, 121D VIBRATION ARM
122A, 122B, 122C, 122D MASS-ADDING PORTION
123A, 123B, 123C, 123D ARM PORTION
125A, 125B, 125C, 125D MASS-ADDING FILM
130 BASE
131A FRONT END PORTION
131B REAR END PORTION
131C LEFT END PORTION
131D RIGHT END PORTION
140 HOLDING PORTION
141A, 141B, 141C, 141D FRAME BODY
150 SUPPORT ARM PORTION
151A, 151B SUPPORT ARM
152A, 152B SUPPORT REAR ARM
153A, 153B SUPPORT SIDE ARM
155 CONNECTING ARM
LA VIBRATION ARM LENGTH
LB BASE LENGTH
LS SUPPORT ARM LENGTH
P VIRTUAL PLANE
r1, r2 CENTER AXIS
WA VIBRATION ARM WIDTH
WB BASE WIDTH
WG WIDTH
WS SUPPORT ARM WIDTH

The invention claimed is:

1. A resonator, comprising:
a vibration member including three or more vibration arms that each have a fixed end, and a base having a first end connected with the respective fixed ends of each of the vibration arms and a second end that opposes the first end;
a frame configured to hold the vibration member;
a pair of support arms that each have a first end connected to the frame and a second end that is connected to one location at the second end of the base; and
a connecting arm having a uniform width and that directly connects the second ends of the pair of support arms to the second end of the base,
wherein the pair of support arms each has a uniform width and converge to each other at the respective second ends.

2. The resonator according to claim 1, wherein at least two vibration arms of the three or more vibration arms are configured to perform out-of-plane bending at different phase.

3. The resonator according to claim 1, wherein the second ends of the pair of support arms are directly coupled to each other.

4. The resonator according to claim 1, wherein the second ends of the pair of support arms are connected to the one location at a center of the second end of the base in a plan view thereof.

5. The resonator according to claim 1, wherein the base has a length in a length direction from the first end towards the second end that is 0.3 times or less a width of the base in a width direction that is orthogonal to the length direction.

6. The resonator according to claim 5, wherein the length of the base is 90 µm or less, and the width of the base is 300 µm or less.

7. The resonator according to claim 1, wherein each of the pair of support arms has a support arm length that is four times or more than a support arm width of each of the pair of support arms.

8. The resonator according to claim 7, wherein the support arm length is 300 µm or less and the support arm width is 60 µm or less.

9. The resonator according to claim 1, wherein each of the pair of support arms comprises:
a support side arm connected to the respective first end of the support arm that is connected to the frame, and
a support rear arm that extends from the respective support side arm in a direction orthogonal thereto and extends to the second end of the respective support arm.

10. The resonator according to claim 9, wherein the respective support side arms extend in a same direction as the three or more vibration arms.

11. The resonator according to claim 10, wherein the respective support rear arms extend in a direction parallel to the second end of the base.

12. The resonator according to claim 11, wherein the connecting arm extends in the same direction as the three or more vibration arms.

13. A resonance device, comprising:
the resonator according to claim 1.

14. The resonance device according to claim 13, further comprising a lid body.

15. A resonator, comprising:
a vibration member including a base have opposing first and second sides with three or more vibration arms extending in a first direction from the first side of the base;
a frame that surrounds at least a portion of the vibration member;
a pair of support arms each having:
a first end connected to a respective side of the frame,
a support side arm extending from the first end in the first direction, a support rear arm extending in a second direction orthogonal to the first direction, and a second end disposed at an end of the support rear arm; and a connecting arm having a uniform width and that directly connects the second end of each of the pair of support arms to the second side of the base, wherein the respective second ends of the pair of support arms converge to each other and connect to the second side of the base at a single point on the base, and wherein the pair of support arms each has a uniform width and converge to each other at the respective second ends.

16. The resonator according to claim 15, wherein the second ends of the pair of support arms are directly coupled to each other.

17. The resonator according to claim 15, wherein the second ends of the pair of support arms are connected together to a center of the second side of the base in a plan view thereof.

18. The resonator according to claim 15, wherein the base has a length in a length direction from the first side towards the second side that is 0.3 times or less a width of the base in a width direction that is orthogonal to the length direction.

19. The resonator according to claim 15, wherein each of the pair of support arms comprises:

a support side arm connected to the respective first end of the support arm that is connected to the frame, and a support rear arm that extends from the respective support side arm in a direction orthogonal thereto and extends to the second end of the respective support arm.

20. The resonator according to claim 15, wherein the connecting arm extends in the first direction.

* * * * *